(12) United States Patent
Nurvitadhi et al.

(10) Patent No.: US 11,625,245 B2
(45) Date of Patent: Apr. 11, 2023

(54) COMPUTE-IN-MEMORY SYSTEMS AND METHODS

(71) Applicant: Intel Corporation, Santa Clara, CA (US)

(72) Inventors: Eriko Nurvitadhi, Hillsboro, OR (US); Scott J. Weber, Piedmont, CA (US); Ravi Prakash Gutala, San Jose, CA (US); Aravind Raghavendra Dasu, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 928 days.

(21) Appl. No.: 16/146,586

(22) Filed: Sep. 28, 2018

(65) Prior Publication Data
US 2019/0042251 A1 Feb. 7, 2019

(51) Int. Cl.
*G06F 9/30* (2018.01)
*G05B 19/05* (2006.01)
*G06N 3/02* (2006.01)
*G06F 15/78* (2006.01)
*G06F 30/34* (2020.01)
*G06F 30/39* (2020.01)

(52) U.S. Cl.
CPC ....... *G06F 9/30036* (2013.01); *G05B 19/056* (2013.01); *G06F 9/3001* (2013.01); *G06F 9/3004* (2013.01); *G06F 15/7821* (2013.01); *G06F 30/34* (2020.01); *G06F 30/39* (2020.01); *G06N 3/02* (2013.01); *G05B 2219/21109* (2013.01)

(58) Field of Classification Search
CPC .. G06F 9/30036; G06F 9/3001; G06F 9/3004; G06F 15/7821; G06F 30/34; G06F 30/39; G06F 15/7867; G05B 19/056; G05B 2219/21109; G06N 3/02; G06N 3/063
See application file for complete search history.

(56) References Cited

U.S. PATENT DOCUMENTS

| | | | |
|---|---|---|---|
| 6,802,026 B1 * | 10/2004 | Patterson | G06F 11/362 712/227 |
| 6,912,164 B1 * | 6/2005 | Chong | G11C 7/20 365/189.12 |
| 9,761,300 B1 * | 9/2017 | Willcock | G11C 7/1006 |
| 10,073,733 B1 * | 9/2018 | Jain | G06F 11/1044 |
| 10,374,608 B1 * | 8/2019 | Ross | H03K 19/17796 |
| 10,528,613 B2 * | 1/2020 | Zhang | G06F 16/2471 |

(Continued)

OTHER PUBLICATIONS

G. H. Loh, "3D-Stacked Memory Architectures for Multi-core Processors," International Symposium on Computer Architecture, 2008.

(Continued)

*Primary Examiner* — Farley Abad
(74) *Attorney, Agent, or Firm* — Fletcher Yoder, P.C.

(57) ABSTRACT

An integrated circuit device may include programmable logic circuitry on a first integrated circuit die and memory that includes compute-in-memory circuitry on a second die. The programmable logic circuitry may be programmed with a circuit design that operates on a first set of data. The compute-in-memory circuitry of the memory may perform an arithmetic operation using the first set of data from the programmable logic circuitry and a second set of data stored in the memory.

20 Claims, 12 Drawing Sheets

(56) References Cited

U.S. PATENT DOCUMENTS

| | | | | |
|---|---|---|---|---|
| 2010/0271071 | A1* | 10/2010 | Bartley | H01L 25/0657 |
| | | | | 326/101 |
| 2016/0104517 | A1* | 4/2016 | Park | G11C 5/04 |
| | | | | 365/189.17 |
| 2016/0329975 | A1* | 11/2016 | Jurisch | G05B 19/0423 |
| 2017/0344301 | A1* | 11/2017 | Ryu | G06F 15/785 |
| 2018/0074958 | A1* | 3/2018 | Jayasena | G06F 12/0815 |
| 2018/0075339 | A1* | 3/2018 | Ma | G06N 3/084 |
| 2018/0081583 | A1* | 3/2018 | Breternitz | G06F 12/00 |
| 2019/0087708 | A1* | 3/2019 | Goulding | G06F 12/0824 |
| 2019/0180170 | A1* | 6/2019 | Huang | G06F 13/4068 |

OTHER PUBLICATIONS

D. H. Kim, et al., "3D-MAPS: 3D Massively parallel processor with stacked memory," International Solid-State Circuits Conference, 2012.

Q. Zhu, et al., ss"A 3D-stacked logic-in-memory accelerator for application-specific data intensive computing," IEEE International 3D Systems Integration Conference, 2013.

J. Aydonat, et al., "An OpenCLTM Deep Learning Accelerator on Arria 10," International Symposium on Field-Programmable Gate Arrays, 2017.

E. Chung, et al., "Serving DNNs in Real Time at Datacenter Scale with Project Brainwave," IEEE Micro, 2018.

\* cited by examiner

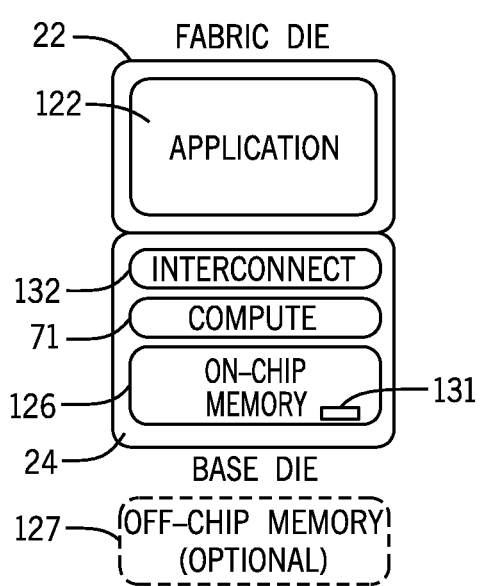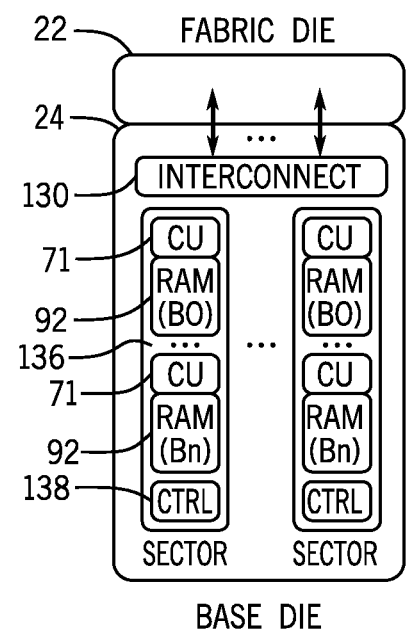
FIG. 7
FIG. 8

COMPUTE-IN-MEMORY SYSTEMS AND METHODS

BACKGROUND

This disclosure relates to circuitry to perform arithmetic computations in memory of a first integrated circuit die accessible by a separate integrated circuit die.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Modern electronics such as computers, portable devices, network routers, data centers, Internet-connected appliances, and more, tend to include at least one integrated circuit device. Integrated circuit devices take a variety of forms, including processors, memory devices, and programmable devices, to name only a few examples. A field-programmable gate array (FPGA) is one type of programmable device that utilizes integrated circuits. Programmable devices may include logic that may be programmed (e.g., configured) after manufacturing to provide a wide variety of functionality based on various designs possible within the programmable devices. Thus, programmable devices contain programmable logic (e.g., logic blocks) that may be configured and reconfigured to perform a variety of functions on the devices, according to a configured design.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. For example, programmable logic devices may be programmed as accelerators for artificial intelligence (AI) technologies that may involve machine learning or related high-intensity computing. The accelerator may perform calculations using compute units on the programmable logic device. Meanwhile, certain data used in the computations, such as weight matrices for neural network nodes, may be stored in memory off-chip. To perform calculations using the accelerator, the data stored in the memory first may be transferred from the memory to the accelerator. Thus, bandwidth and latency constraints may increasingly impact the operation of the accelerators as the amount of data stored off-chip increases.

BRIEF DESCRIPTION OF THE DRAWINGS

Various aspects of this disclosure may be better understood upon reading the following detailed description and upon reference to the drawings in which:

FIG. 7 is a block diagram of the fabric die in communication with memory on the base die to perform compute-in-memory arithmetic computations on the base die, in accordance with an embodiment;

FIG. 8 is a block diagram illustrating the compute-in-memory arithmetic computations performed using compute units integrated with memory sectors on the base die, in accordance with an embodiment;

DETAILED DESCRIPTION OF SPECIFIC EMBODIMENTS

Figure 1:
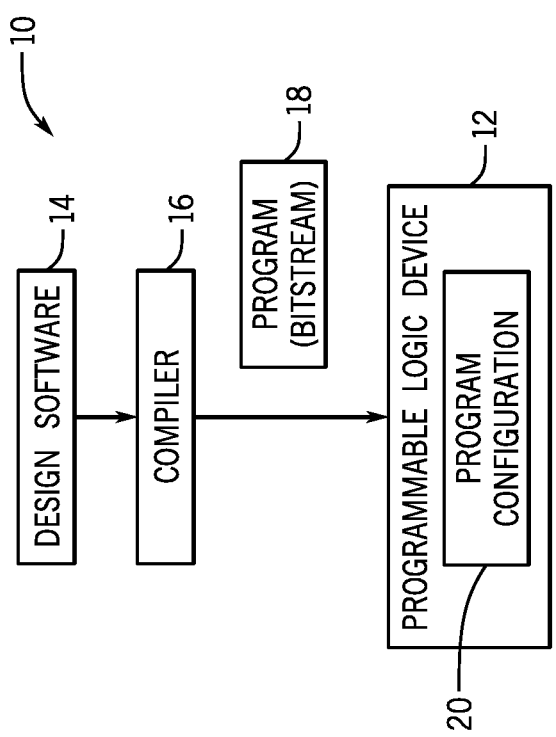
FIG. 1 is a block diagram of a programmable logic device that is programmed with a circuit design, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices (e.g., an FPGA) makes them an excellent fit for accelerating many computing tasks. One accelerator function that may involve programmable logic devices is artificial intelligence (AI). Indeed, AI algorithms are constantly changing and programmable logic devices may be easily reconfigured with different circuit designs to support new AI algorithms. The AI algorithms may perform arithmetic computations such as matrix multiplications, convolution operations, and the like. While this disclosure will describe accelerator functions relating to artificial intelligence (AI) or machine learning (ML), it should be understood that any other suitable form of acceleration may be used.

Since arithmetic computations used to accelerate certain tasks (e.g., to carry out an AI algorithm) may use a large amount of data, the data may be stored on an off-chip memory device. Yet there may be bandwidth and/or latency constraints transferring the data to and from the off-chip memory device. These constraints may be mitigated using compute-in-memory circuitry located in the off-chip memory. Indeed, many arithmetic computations that might otherwise occur in programmable logic fabric (e.g., programmable logic circuitry, such as FPGA circuitry) of the programmable logic device may instead take place in the compute-in-memory circuitry in the off-chip memory.

With the foregoing in mind, FIG. 1 illustrates a block diagram of a system 10 that may employ a programmable logic device 12 on a die that may communicate with a separate base die to perform compute-in-memory arithmetic computations. Using the system 10, a designer may implement a circuit design functionality on an integrated circuit, such as a reconfigurable programmable logic device 12, such as a field programmable gate array (FPGA). The designer may implement a circuit design to be programmed onto the programmable logic device 12 using design software 14, such as a version of Intel® Quartus® by Intel Corporation of Santa Clara, Calif. The design software 14 may use a compiler 16 to generate a low-level circuit-design defined by bitstream 18, sometimes known as a program object file and/or configuration program that programs the programmable logic device 12. Thus, the compiler 16 may provide machine-readable instructions representative of the circuit design to the programmable logic device 12. For example, the programmable logic device 12 may receive one or more configuration programs (bitstreams) 18 that describe the hardware implementations that should be stored in the programmable logic device 12. A configuration program (e.g., bitstream) 18 may be programmed into the programmable logic device 12 as a configuration program 20. The configuration program 20 may, in some cases, represent an accelerator function to perform machine learning, video processing, voice recognition, image recognition, or other highly specialized task.

Figure 2:
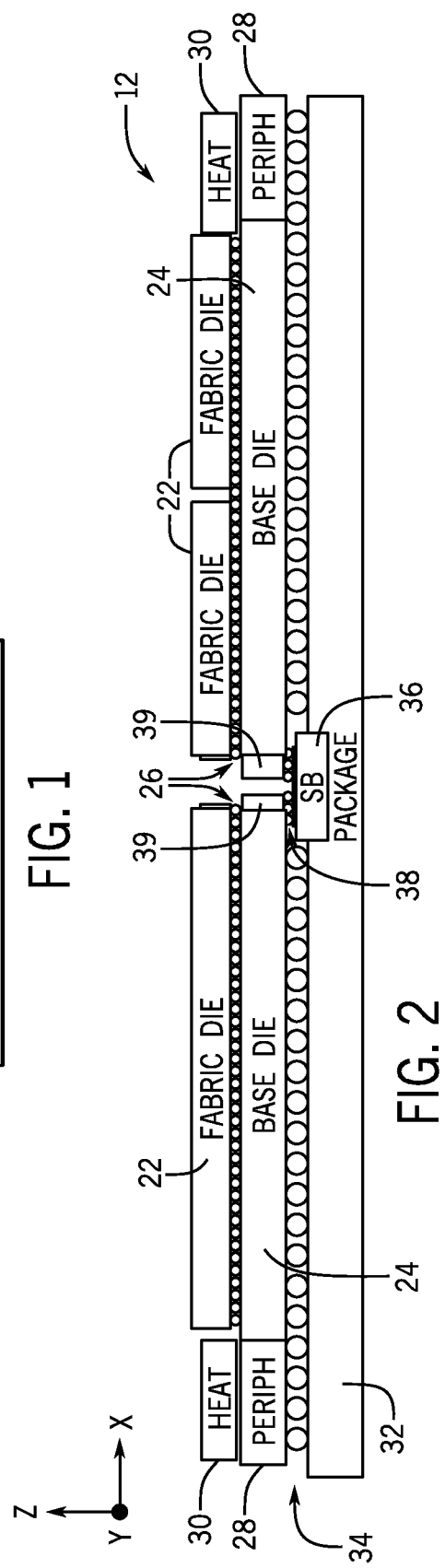
FIG. 2 is a block diagram of a package including the programmable logic device where a fabric die is vertically stacked with a base die, in accordance with an embodiment.

To carry out the systems and methods of this disclosure, the programmable logic device 12 may include a fabric die 22 that communicates with a base die 24, as shown in FIG. 2. The base die 24 may perform compute-in-memory arithmetic computations in the memory of the base die 24, while the fabric die 22 may be used for general purposes. For example, the fabric die 22 may be configured with an accelerator function topology that coordinates with compute-in-memory circuitry in the base die 24. As such, and in one embodiment, the programmable logic device 12 may be the fabric die 22 stacked on the base die 24, creating a 3D stack to perform compute-in-memory arithmetic computations. However, in other examples, the base die 24 and the fabric die 22 may be side-by-side and connected to one another via an interposer or bridge (e.g., an embedded multi-die interconnect bridge (EMIB)) in a 2.5D form. The compute-in-memory architecture may allow compute units and the data used for computations to be stored in the same place (in the base die 24 memory), allowing for efficient and rapid data-intensive computations.

One example of the programmable logic device 12 is shown in FIG. 2, but any suitable programmable logic device may be used. In the example of FIG. 2, the programmable logic device 12 includes the fabric die 22 and the base die 24 that are connected to one another via microbumps 26. Although the fabric die 22 and base die 24 appear in a one-to-one relationship in FIG. 2, other relationships may be used. For example, a single base die 24 may attach to several fabric die 22, or several base die 24 may attach to a single fabric die 22, or several base die 24 may attach to several fabric die 22 (e.g., in an interleaved pattern along the x- and/or y- direction). Peripheral circuitry 28 may be attached to, embedded within, and/or disposed on top of the base die 24, and heat spreaders 30 may be used to reduce an accumulation of heat on the programmable logic device 12. The heat spreaders 30 may appear above, as pictured, and/or below the package (e.g., as a double-sided heat sink). The base die 24 may attach to a package substrate 32 via C4 bumps 34. In the example of FIG. 2, two pairs of fabric die 22 and base die 24 are shown communicatively connected to one another via a silicon bridge 36 (e.g., an embedded multi-die interconnect bridge (EMIB)) and microbumps 38 at a silicon bridge interface 39.

Although the microbumps 26 and the microbumps 38 are described as being employed between the fabric die 22 and the base die 24 or between the edge devices, such as the silicon bridge 36 and the silicon bridge interface 39, it should be noted that microbumps may be employed at any suitable position between the components of the programmable logic device 12. For example, the microbumps may be incorporated in any suitable position (e.g., middle, edge, diagonal) between the fabric die 22 and the base die 24. In the same manner, the microbumps may be incorporated in any suitable pattern or amorphous shape to facilitate interconnectivity between various components described herein.

Figure 3:
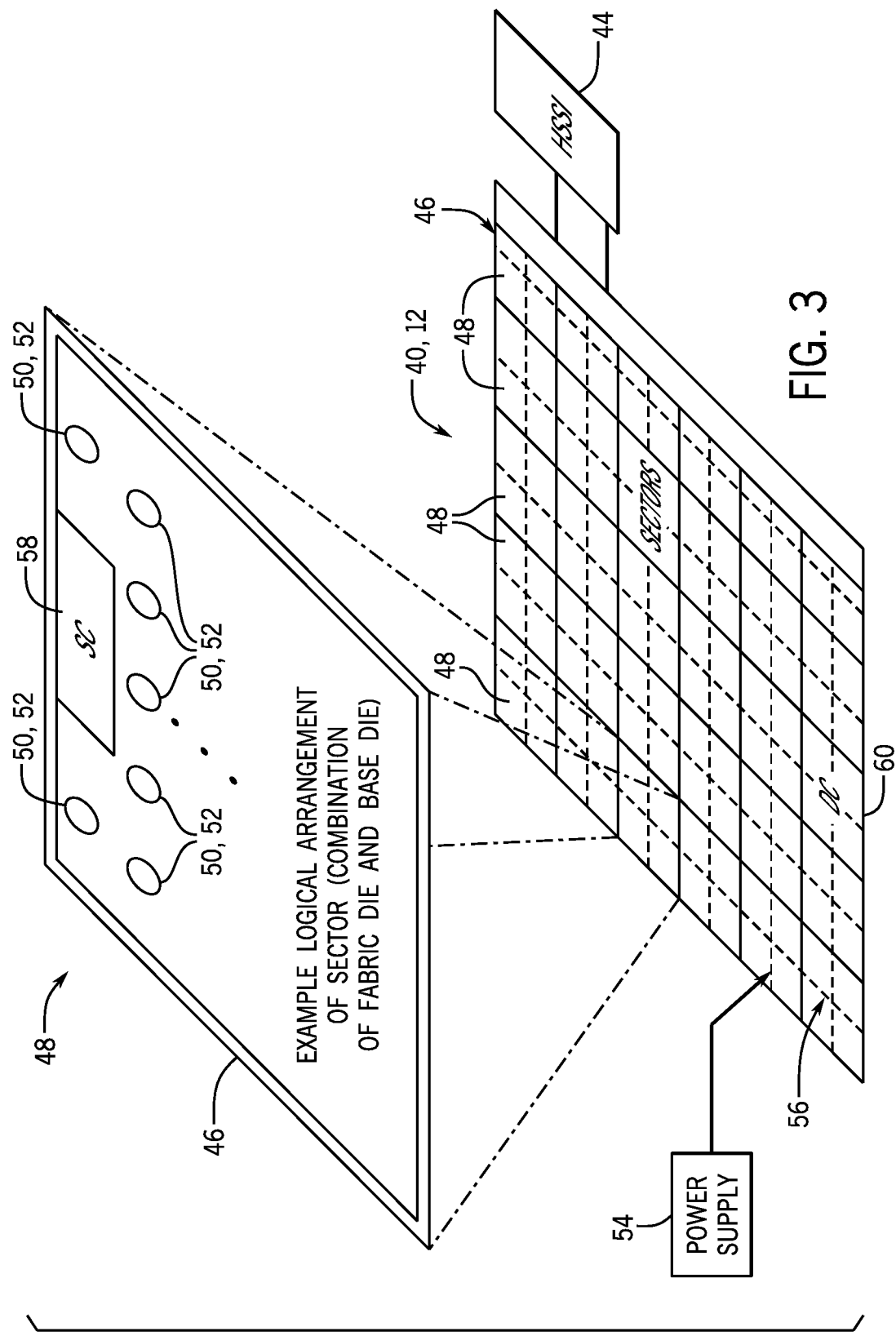
FIG. 3 is a block diagram of an example logical arrangement of the programmable logic device, in accordance with an embodiment.

In combination, the fabric die 22 and base die 24 may operate as a programmable logic device such as a field programmable gate array (FPGA). For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when the both the fabric die 22 and the base die 24 operate in combination. In other words, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as an FPGA, though it should be understood that the device may be any suitable type of programmable logic device (e.g., an application-specific integrated circuit and/or application-specific standard product).

In the example of FIG. 3, the FPGA 40 may include transceiver circuitry (high speed serial interface (HSSI)) 44 for driving signals off of the FPGA 40 and for receiving signals from other devices. The transceiver circuitry (HSSI) 44 may be part of the fabric die 22, the base die 24, or a separate die altogether. Interconnection resources 46 may be used to route signals, such as clock or data signals, through the FPGA 40. The FPGA 40 of FIG. 3 is shown to be sectorized, meaning that programmable logic resources may be distributed through a number of discrete programmable logic sectors 48 (e.g., region, portion). Each programmable logic sector 48 may include a number of programmable logic elements 50 (also referred herein as FPGA fabric 50) having operations defined by configuration memory 52 (e.g., configuration random access memory (CRAM)). The programmable logic elements 50 may include combinational or sequential logic circuitry. For example, the programmable logic elements 50 may include look-up tables, registers, multiplexers, routing wires, and so forth. A designer may program the programmable logic elements 50 to perform a variety of desired functions. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while 29 programmable logic sectors 48 are shown here, it should be appreciated that more or fewer may appear in an actual implementation (e.g., in some cases, there may be only one sector, while in others there may be on the order of 50, 100, or 1000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60 and may read data from and write data into its configuration memory 52 based on control signals from the device controller 60. In addition to these operations, the sector controller 58 and/or device controller 60 may be augmented with numerous additional capabilities. Such capabilities may include coordinating memory transactions between local in-fabric memory (e.g., local fabric memory or CRAM being used for data storage), transactions between sector-aligned memory associated with that particular programmable logic sector 48, decrypting configuration data (bitstreams) 18, and locally sequencing reads and writes to implement error detection and correction on the configuration memory 52, and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data is loaded into the configuration memory 52 using pins and input/output circuitry. In one example, the configuration memory 52 may be implemented as configuration random-access-memory (CRAM) cells. The use of configuration memory 52 based on RAM technology described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may configure the gates of metal-oxide-semiconductor (MOS) transistors that control the states of the programmable logic elements 50 or programmable components of the interconnection resources 46.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50 and configuration memory 52. In some cases, this may also entail certain fabric control circuitry such as the sector controller (SC) 58 or device controller (DC) 60. The base die 24 may include supporting circuitry to operate the programmable logic elements 50 and configuration memory 52. Shown here, the base die 24 includes sector 1 support circuitry 70A and sector 2 support circuitry 70B to support two corresponding sectors of the programmable logic elements 50 and configuration memory 52 of the fabric die 22. The base die 24 may also include support circuitry for other sectors of the fabric die 22.

Thus, while the fabric die 22 may include primarily programmable logic fabric resources, such as the programmable logic elements 50 and configuration memory 52, the base die 24 may include, among other things, a device controller (DC) 60, a sector controller (SC) 58, a network-on-chip (NOC), a configuration network on chip (CNOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, to name just a few elements that may be present on the base die 24. As shown, and in some embodiments, the base die 24 may also include compute-in-memory circuitry 71 (e.g., compute circuitry units) within the sectors, which may use data stored in the sector-aligned memory to perform arithmetic computations used for accelerators, such as computations for machine learning that may be used in AI techniques. The base die 24 may include memory (e.g., sector-aligned memory) and the compute-in-memory circuitry 71 may be integrated in memory to allow for compute-in-memory computations. It should be understood that some of these elements that may be part of the fabric support circuitry of the base die 24 may additionally or alternatively be a part of the fabric die 22. For example, the device controller (DC) 60 and/or the sector controllers (SC) 58 may be part of the fabric die 22.

Figure 4:
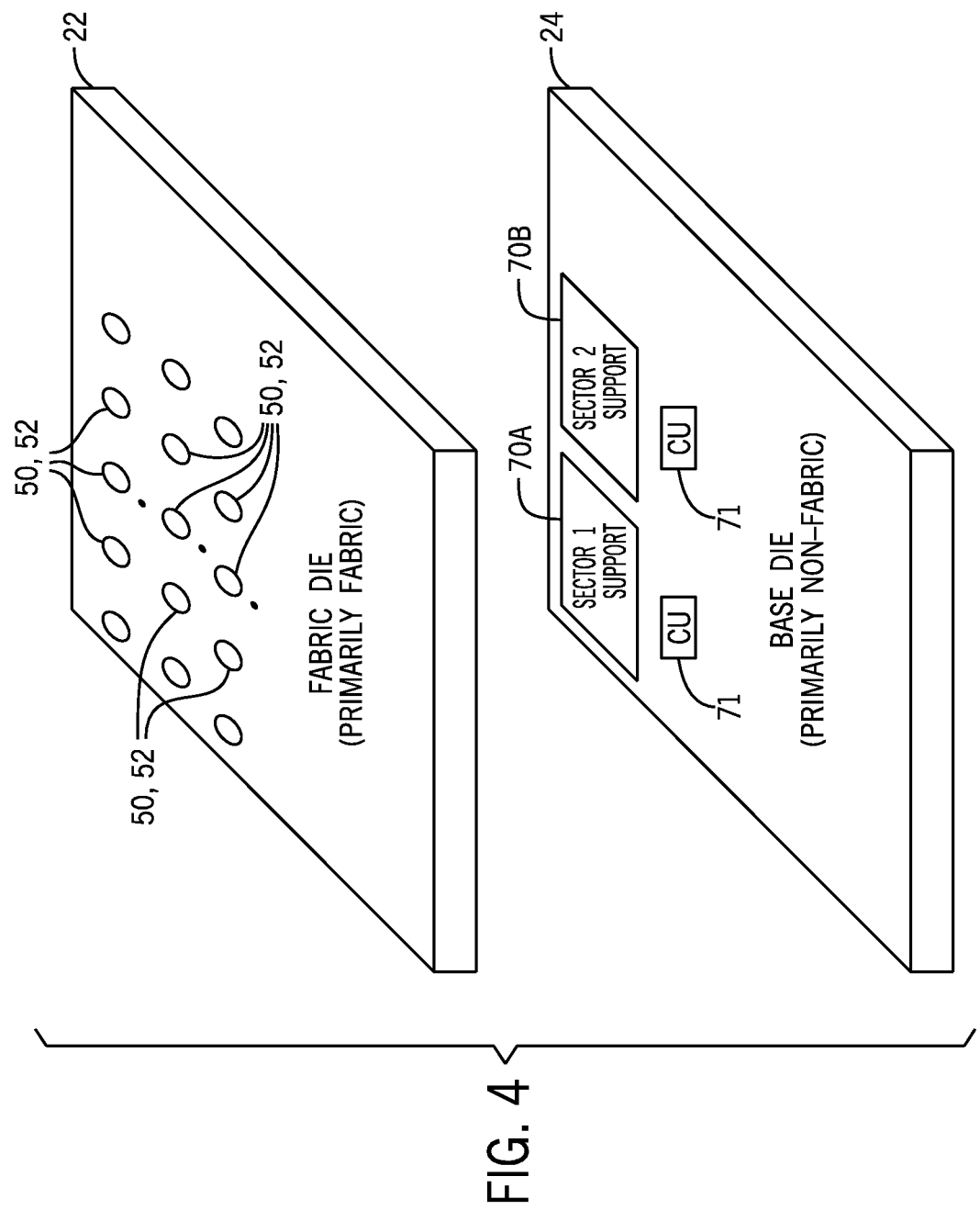
FIG. 4 is a block diagram illustrating a fabric die of the programmable logic device that contains programmable logic fabric and a base die of the programmable logic device that contains primarily non-fabric circuitry that operates the programmable logic fabric and may be used for performing compute-in-memory operations, in accordance with an embodiment.

While FIG. 4 represents an example where the fabric die 22 contains primarily programmable logic fabric, with most other components located in the base die 24, the fabric die 22 may contain some of the other components to support the programmable logic fabric. Thus, in some embodiments, the fabric die 22 or the base die 24 may include one or more of a device controller (DC) 60, a sector controller (SC) 58, a network-on-chip (NOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, and other elements.

Figure 5:
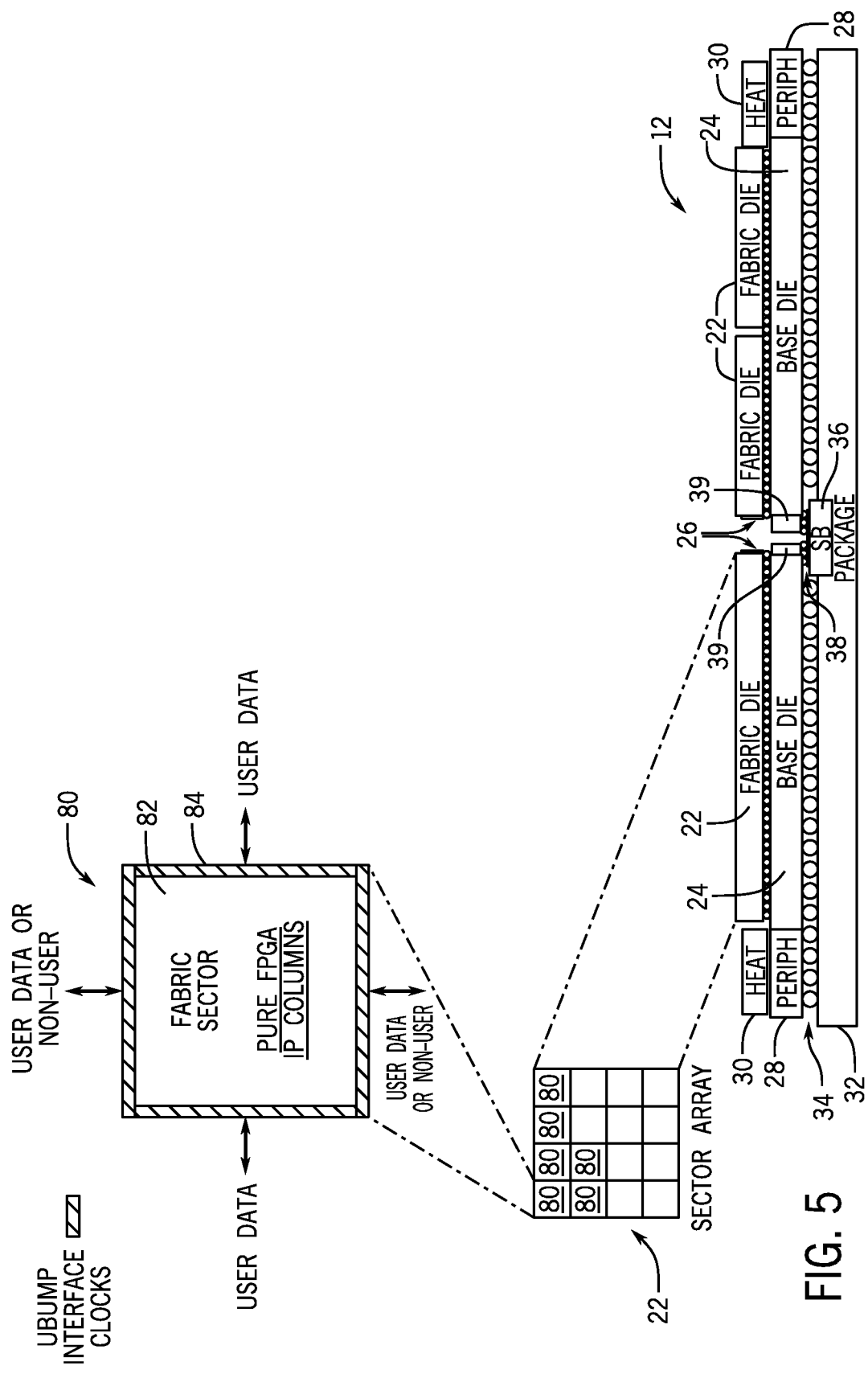
FIG. 5 is a block diagram of an example topology of the base die having a sector-aligned memory that may be used for performing compute-in-memory operations, in accordance with an embodiment.

One example physical arrangement of the fabric die 22 and the base die 24 is shown in FIG. 5. As illustrated, the fabric die 22 is shown to contain an array of fabric sectors 80 that include fabric resources 82 (e.g., programmable elements programmed by CRAM and/or certain fabric control circuitry such as the sector controller (SC) 58 or device controller (DC) 60) and interface circuitry 84. The interface circuitry 84 may include data routing and/or clocking resources or may include an interface to data routing and/or clocking resources on the base die 24. Thus, the interface circuitry 84 may connect with a micro-bump (ubump) interface of FIG. 2 to connect to the base die 24.

Figure 6:
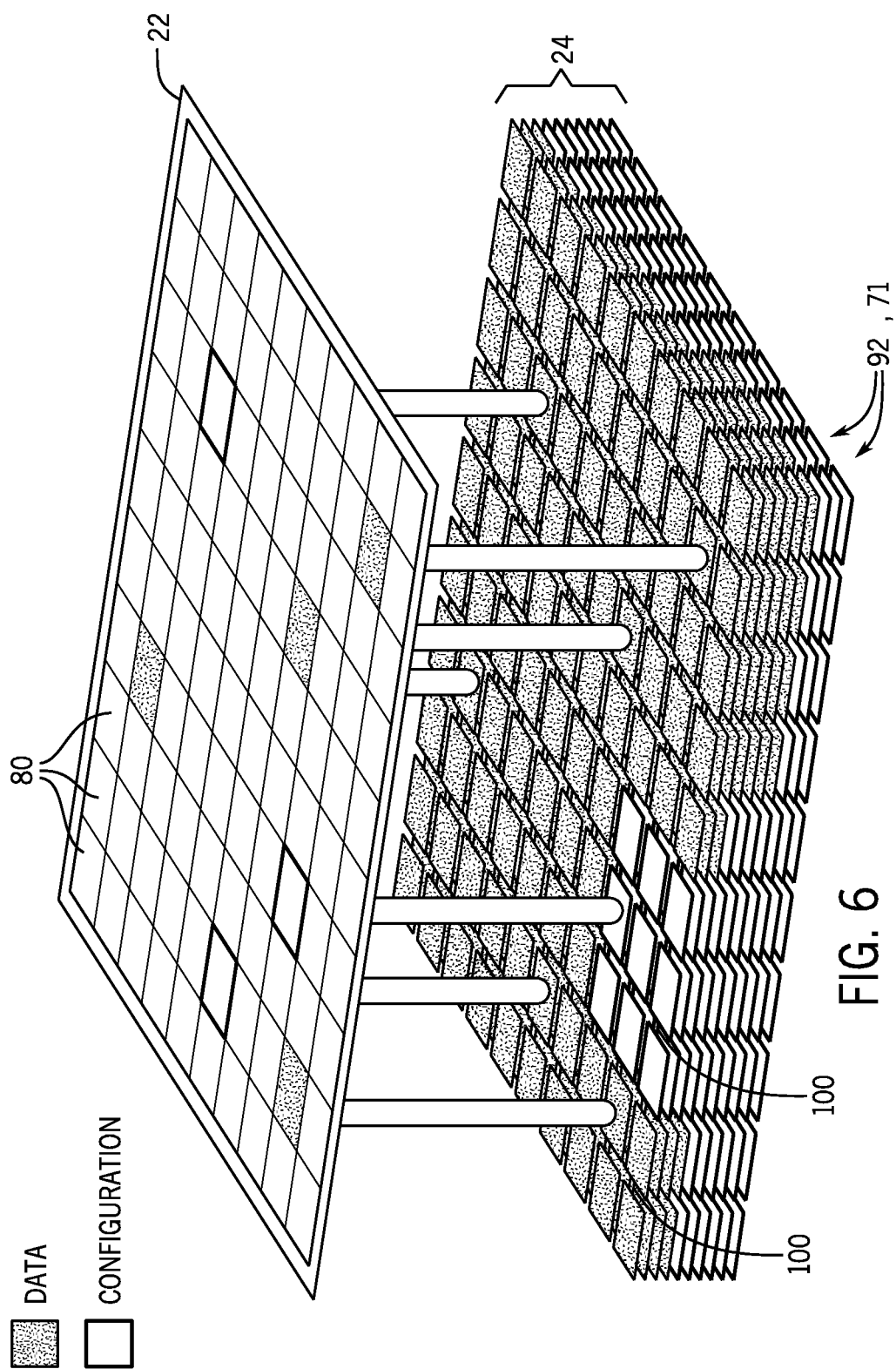
FIG. 6 is a schematic block diagram of sector-aligned memory of the base die that may be stacked parallel to a fabric die of the programmable logic device to support rapid configuration, caching, and/or computation for corresponding sectors of the fabric die, in accordance with an embodiment.

As shown in FIG. 6, the fabric die 22 and the base die 24 may aligned or stacked vertically. By vertically aligning the fabric die 22 and the base die 24 with incorporated NOC 100 in the base die 24, memory located in the base die 24 may be accessible in parallel to fabric sectors 80 of the fabric die 22. FIG. 6 shows an example in which the sector-aligned memory 92 is integrated with compute-in-memory circuitry 71. As will be discussed below, the compute-in-memory circuitry 71 may represent circuitry to perform compute-in-memory operations. The sector-aligned memory 92 may be directly accessible to respective fabric sectors 80 of the fabric die 22 and may contain user data (generated by or accessible by a circuit design programmed into the programmable logic fabric of the base die 24) or configuration data.

In this disclosure, "directly accessible" refers to a connection between a region of the sector-aligned memory 92 that is associated with a particular fabric sector 80 and provides direct access to that particular fabric sector 80. In some embodiments, each respective region of the sector-aligned memory 92 associated with a particular fabric sector 80 may be directly accessible to that particular fabric sector 80, thereby providing each fabric sector 80 with direct access to that region of the sector-aligned memory 92. For example, there may be N regions of sector-aligned memory 92 that can be accessible by N corresponding fabric sectors 80 at the same time (e.g., in parallel). In some cases, the sector-aligned memory 92 may be accessible to more than one fabric sector 80 or multiple sectors of sector-aligned memory 92 may be accessible to a single fabric sector 80. Thus, in some cases, the same region of sector-aligned memory 92 may be directly accessible to multiple fabric sectors 80, while in other cases, a region of sector-aligned memory 92 may be directly accessible only to a single fabric sector 80. In the example of FIG. 6, the fabric sectors 80 may access specific regions of sector-aligned memory 92. The sector-aligned memory 92 is shown in FIG. 6 as vertically stacked memory. This may allow a large amount of memory to be located within the base die 24. However, the sector-aligned memory 92 may occupy a single plane of the base die 24 in some embodiments. As mentioned above, to facilitate the use of the sector-aligned memory 92, the embedded NOC 100 or another interconnect may enable communication between memory components of the sector-aligned memory 92 of the base die 24 and the sectors 48 or other components (e.g., CRAM) of the fabric die 22.

As mentioned above, the programmable logic device 12 may include programmable logic elements 50 that are controlled by configuration memory 52 in the fabric die 22. By programming the configuration memory 52 (in a process known as "configuration"), different circuit designs may be programmed into the programmable logic device 12. A circuit design defining an application 122 (e.g., an accelerator function such as an artificial intelligence (AI) function) that may involve a large amount of data, as in the example shown in FIG. 7. In this case, much of the data may reside in on-chip memory 126 (e.g., which may represent memory of the sector-aligned memory 92) in the base die 24 (which may be understood to be off-chip from the fabric die 22) and/or in off-chip memory 127 located elsewhere. In the example of FIG. 7, the on-chip memory 126 stores computational data 131 that may be used in computations by the compute-in-memory circuitry 71 to carry out requests by the application 122. The application 122 may communicate with the on-chip memory 126 via an interconnect 132, which may represent the silicon bridge 36 of FIG. 2, microbumps, 3D links, or the like.

The computational data 131 may represent any suitable data used by the application 122. For example, the computational data 131 may represent artificial intelligence (AI) predictors, weights, or forecasts, among other values, when the application 122 represents an artificial intelligence (AI) function, such as an artificial neural network. Generally, artificial neural networks are statistical models directly modeled on biological neural networks. They are capable of modeling and processing nonlinear relationships between inputs and outputs in parallel. The related neural network algorithms are part of the broader field of machine learning, and may be used in many AI applications. The neural network may be illustrated as a network of neurons that may be organized in layers. The predictors (or inputs, "I") form the bottom layer of neurons and the forecasts (or outputs, "O") form the top layer of neurons. Artificial neural networks may contain adaptive weights, "W" along paths between neurons that can be tuned by learning algorithms that "learn" from observed data, where the adaptive weights "W" may be changed to improve the model. The outputs are obtained by a linear combination of the inputs. There may also be intermediate layers containing hidden neurons. The simplest neural networks may contain no hidden layers and are equivalent to linear regressions. The inputs, I, the outputs, O, and the weights, W, may represent some of the computational data 131 that may be stored in the on-chip memory 126. In one example, the weights W may be stored as computational data 131 on the on-chip memory 126, and the inputs I may be transmitted from the application 122 via the interconnect 132. The compute-in-memory circuitry 71 may compute the output O from the previously stored weight W and the newly received input I, and the output O may be transmitted back to the application 122 via the interconnect 132.

Since the compute-in-memory circuitry 71 and on-chip memory 126 are both on the same die, the computational data 131 does not have to move between dies for the arithmetic computations to be performed. Rather, the compute-in-memory circuitry 71 performs the computations using the computational data 131 stored on the same die, and then communicates the results to the fabric die 22 using the interconnect 132.

FIG. 8 illustrates an example in which the base die 24 has memory arranged in sectors and integrated with compute-in-memory circuitry 71 to perform compute-in-memory arithmetic computations. As depicted, the on-chip memory 126 may include memory banks divided into multiple memory sectors 136, which may include dedicated blocks of random access memory (RAM), such as the sector-aligned memory 92. Some of the sector-aligned memory 92 may be integrated with compute-in-memory circuitry 71. The compute-in-memory circuitry 71 associated with sector-aligned memory 92 may have a corresponding controller 138 (e.g., a state machine, an instruction set architecture (ISA) based processor, a reduced instruction set computer (RISC) processor, or the like). The controller 138 may be used to move computational data 131 between the sectors 136 and dies 22, 24. The data may be controlled and moved across the various multiple memory sectors using interconnects 130. The movement of the data may take place based on, for example, application-specific calculations, such as AI-specific arithmetic operations. For example, the controller 138 may control a sequence of compute-in-memory operations using multiple integrated sector-aligned memory 92 units and compute-in-memory circuitry 71. In this manner, the fabric die 22 may offload application-specific commands to the compute-in-memory circuitry 71 in the base die 24.

To illustrate some different application-specific compute-in-memory calculations that may be performed using the integrated sector-aligned memory 92 and compute-in-memory circuitry 71 architecture, FIGS. 9A, 9B, 9C, 9D, and 9E depict various operation sequences that may support the computations, such as gather and scatter operations. Briefly, gather and scatter operations are two data-transfer operations, transferring a number of data items by reading from (gathering) or writing to (scattering) a given location.

Figure 9A:
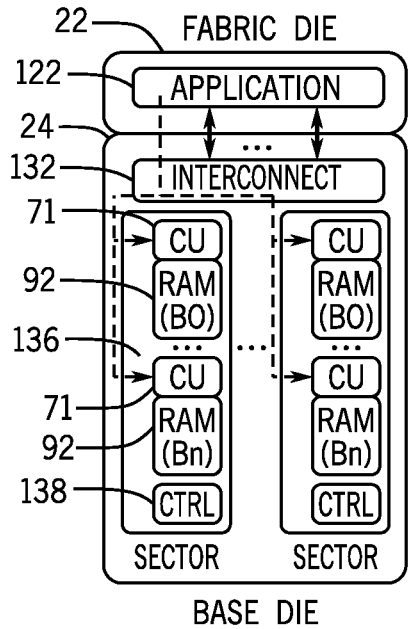
FIG. 9A is a block diagram of scatter operations to communicate an input from the fabric die to compute units of the base die, in accordance with an embodiment.
Figure 9B:
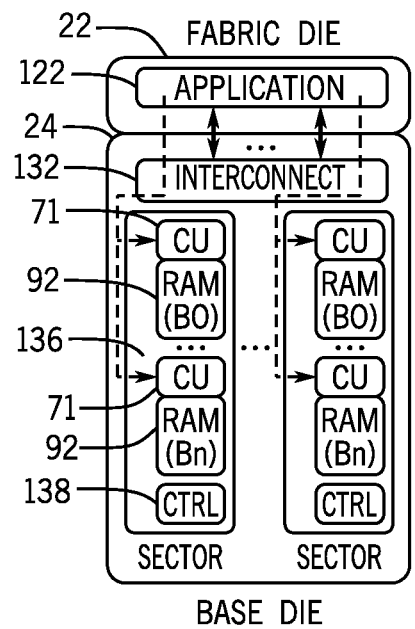
FIG. 9B is a block diagram of multiple scatter operations to communicate multiple inputs from the fabric die to compute units of the base die, in accordance with an embodiment.

As shown in FIG. 9A and FIG. 9B, the application 122 (e.g., programmable logic resources) may concurrently write (scatter) data to multiple compute-in-memory circuitry 71. The scatter pattern may be used to support data communication (e.g., commands) for offloading application-specific arithmetic computations to the base die 24. In FIG. 9A, the application 122 may interface with the base die 24 to broadcast specific data to all or some number of different instances of the compute-in-memory circuitry 71 on the base die 24. This may be referred to as a scatter-all operation.

Similarly, the application 122 may communicate with the base die 24 to scatter specific different data to multiple instances of the compute-in-memory circuitry 71 via multiple interfaces, performing a parallel scatter operation, as shown in FIG. 9B. In this manner, the compute-in-memory circuitry 71 may receive the multiple different data in parallel. Thus, the interconnect paths between the dies 22, 24, the multiple sectors 136, and the sector-aligned memory 92 may allow the compute-in-memory circuitry 71 to efficiently receive scattered data from the application 122 to perform calculations in the sector-aligned memory 92.

Figure 9C:
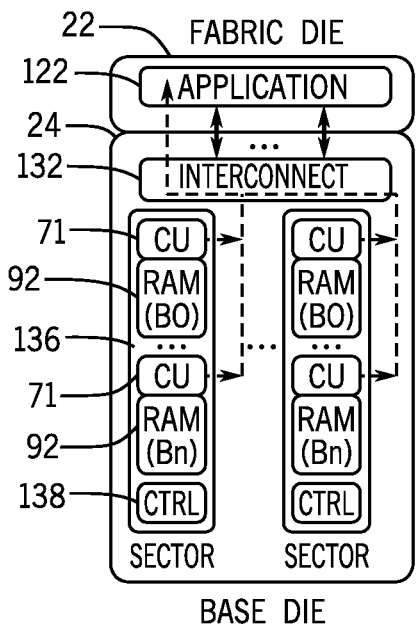
FIG. 9C is a block diagram of gather operations to communicate the results of compute-in-memory computations performed on the compute units of base die to the fabric die, in accordance with an embodiment.
Figure 9D:
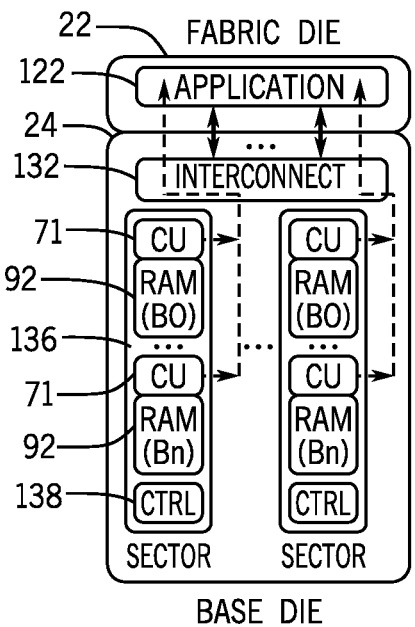
FIG. 9D is a block diagram of multiple gather operations to communicate the results of compute-in-memory computations performed on compute units of the base die to the fabric die, in accordance with an embodiment.

As depicted in FIG. 9C and FIG. 9D, multiple instances of the compute-in-memory circuitry 71 may gather (and/or reduce) their computed data, and then read the data to the application 122. The gather pattern may also be used to support data communication for offloading application-specific arithmetic computations to the base die 24. In FIG. 9C, all or some subset of the instances of the compute-in-memory circuitry 71 may simultaneously or sequentially gather (and/or reduce) computed data to the application 122. This may be referred to as a gather-all operation.

Similarly, the compute-in-memory circuitry 71 may gather computed data to communicate it to the application 122 via multiple interfaces, performing a parallel gather operation, as shown in FIG. 9D. The multiple interfaces may include interconnection paths between the multiple sectors 136 to the application 122. In this manner, the application 122 may gather multiple groups of computed data from the sectors 136 in parallel (e.g., at least partly simultaneously), performing a parallel gather operation.

Figure 9E:
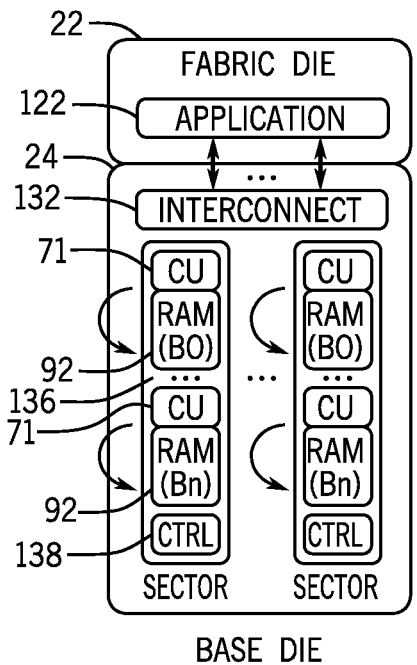
FIG. 9E is a block diagram of sequential compute-in-memory operations performed using compute units of the base die, in accordance with an embodiment.

As shown in FIG. 9E, a sequence of operations may be used to support application-specific compute-in-memory computations. The controller 138 may be instructed to perform a sequence of operations using the compute-in-memory circuitry 71. Specifically, for some AI applications, and as discussed in FIG. 7, the compute-in-memory computations may include determining the product of a matrix and vector. Thus, the controller 138 for each compute-in-memory circuitry 71 may be used to set a sequence of operations to be computed and use interconnect paths between the compute-in-memory circuitry 71 and sectors 136 to determine a product. For example, the controllers 138 may set the sequence of computations performed by the compute-in-memory circuitry 71 to multiply an input vector sent by the application 122 with a set of matrix rows stored in different areas of memory associated with different instances of the compute-in-memory circuitry 71 to determine the product of the vector and matrix. Depending on the arithmetic computation used for the application, the sector-aligned memory 92 may additionally or alternatively store filters or filter coefficients to perform filtering that may be used in computations.

Figure 10:
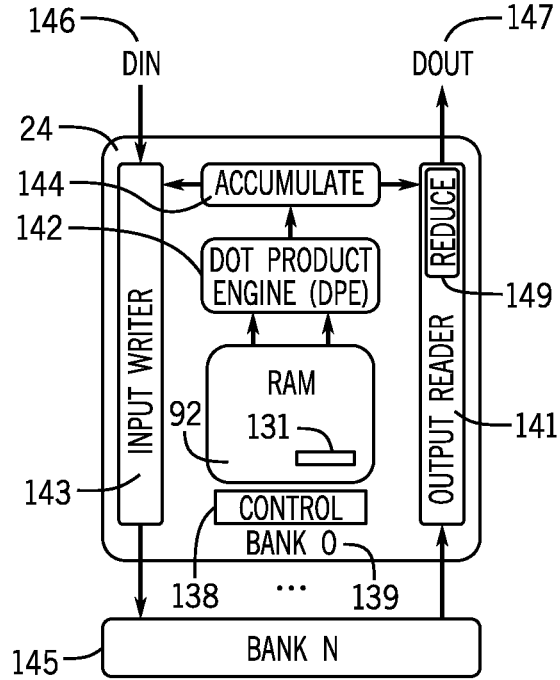
FIG. 10 is a block diagram of compute-in-memory circuitry of the base die that may be used for tensor computations, in accordance with an embodiment.

To further illustrate the various sequential operations that may be used for application-specific computations, FIG. 10 depicts using the compute-in-memory circuitry 71 to perform a compute-in-memory operation that may be used for tensor operations. Tensors are data structures, such as matrices and vectors, that may be used to calculate arithmetic operations. Particularly, dot product of vectors and matrices (matrix multiplication) may be used for deep learning or training an algorithm. Thus, applications that rely on tensor operations, such as AI applications that train algorithms (e.g., machine learning), may benefit from the depicted compute-in-memory architecture.

In FIG. 10, the base die 24 may contain at least one memory bank 139 (bank 0) and up to N (e.g., more than one, N memory bank 145 (bank N)) memory banks. The memory banks 139 . . . 145 may be further divided into sectors of memory. Each memory bank 139 . . . 145 or subdivision of memory (e.g., sector-aligned memory 92) may have a corresponding controller 138. As depicted, the sector-aligned memory 92 may include computational data 131, which may include the data to compute the dot product of vectors and matrices. For example, a vector may be provided by the application 122 on the fabric die 22 while the matrix may be stored in and thus provided by the sector-aligned memory 92. In other implementations, the vector may be provided by a different sector-aligned memory 92 from a different memory bank or sector.

As previously discussed, the controller 138 may control the compute-in-memory circuitry 71 to perform the arithmetic computations. In this example, the compute-in-memory circuitry 71 is operated as a dot product engine (DPE) 142. The dot product engine 142 may compute the dot product of vectors and matrices stored in the sector-aligned memory 91 and/or received by other memory banks/sectors or application 122. As shown, the dot product engine 142 may also receive input data 146 (Din) from application 122 to an input writer 143. The input writer 143 may scatter or write the data to the dot product engine 142 in a broadcast or parallel architecture, as described in reference to FIGS. 11A and 11B.

After the data is received by the dot product engine 142 and/or dot product has been computed, the dot product engine 142 may send the computed data to the sector-aligned memory 92 to store the data for future use or additional computations. Additionally or alternatively, the dot product engine 142 may send the computed data to an accumulator 144. The accumulator 144 may accumulate computed data from the dot product engine 142 and send the data to an output reader 141. The output reader 141 may gather or read the data to the application 122 in a reduced or parallel architecture using a reducer 149. The reducer 149 may combine the accumulated partially computed data from the dot product engine 142 into a final data output 147 ($D_{out}$). The accumulator 144 may also send the accumulated computed data to the input writer 143, which may then write the accumulated computed data to memory bank N 145, sector-aligned memory 92, and/or the dot product engine 142 based on the sequence of operations used to calculate the tensor computations.

Figure 11A:
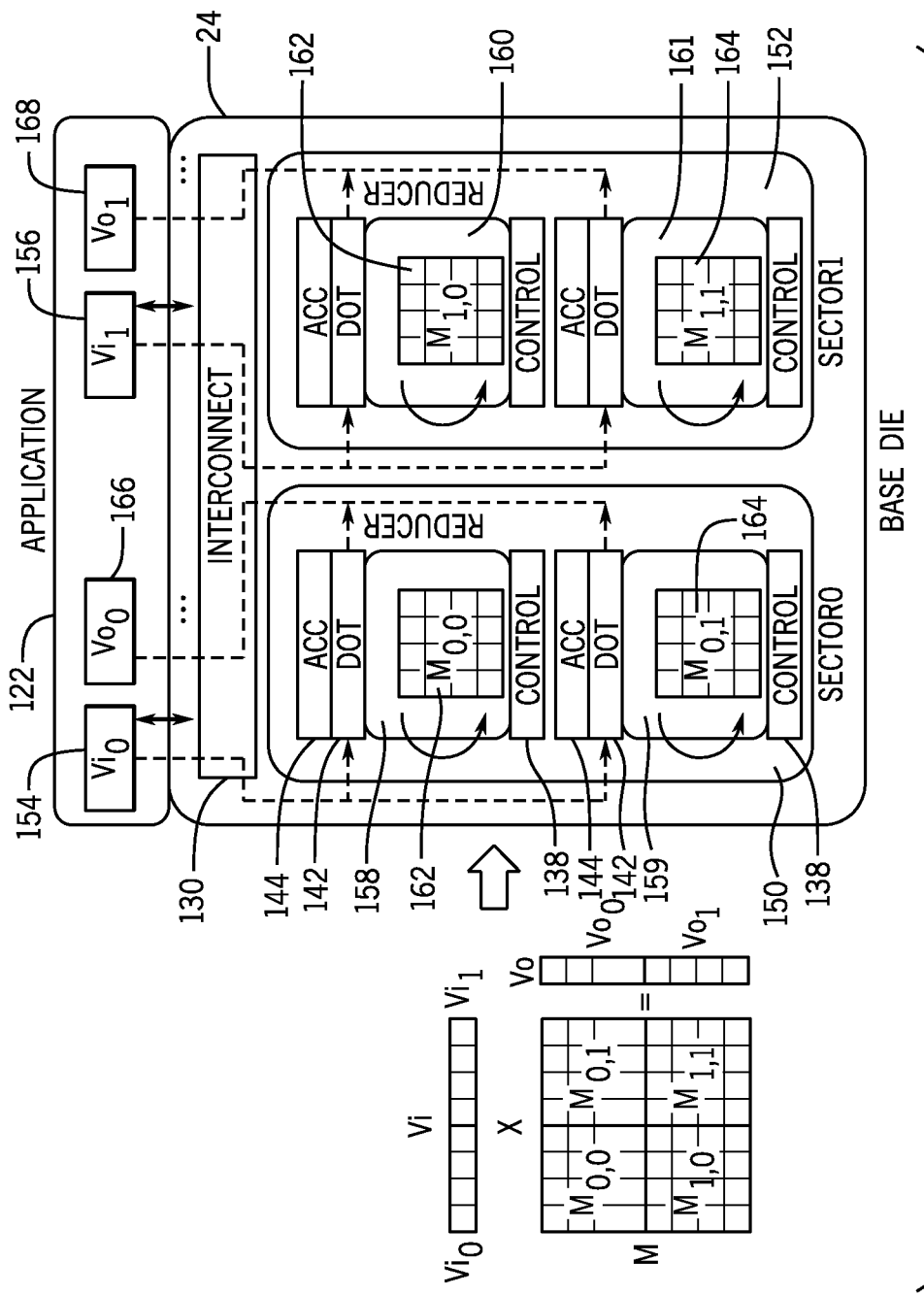
FIG. 11A is a block diagram of a configuration of the compute-in-memory circuitry on the base die that may be used for artificial intelligence (AI) matrix multiplication operations, in accordance with an embodiment.
Figure 11B:
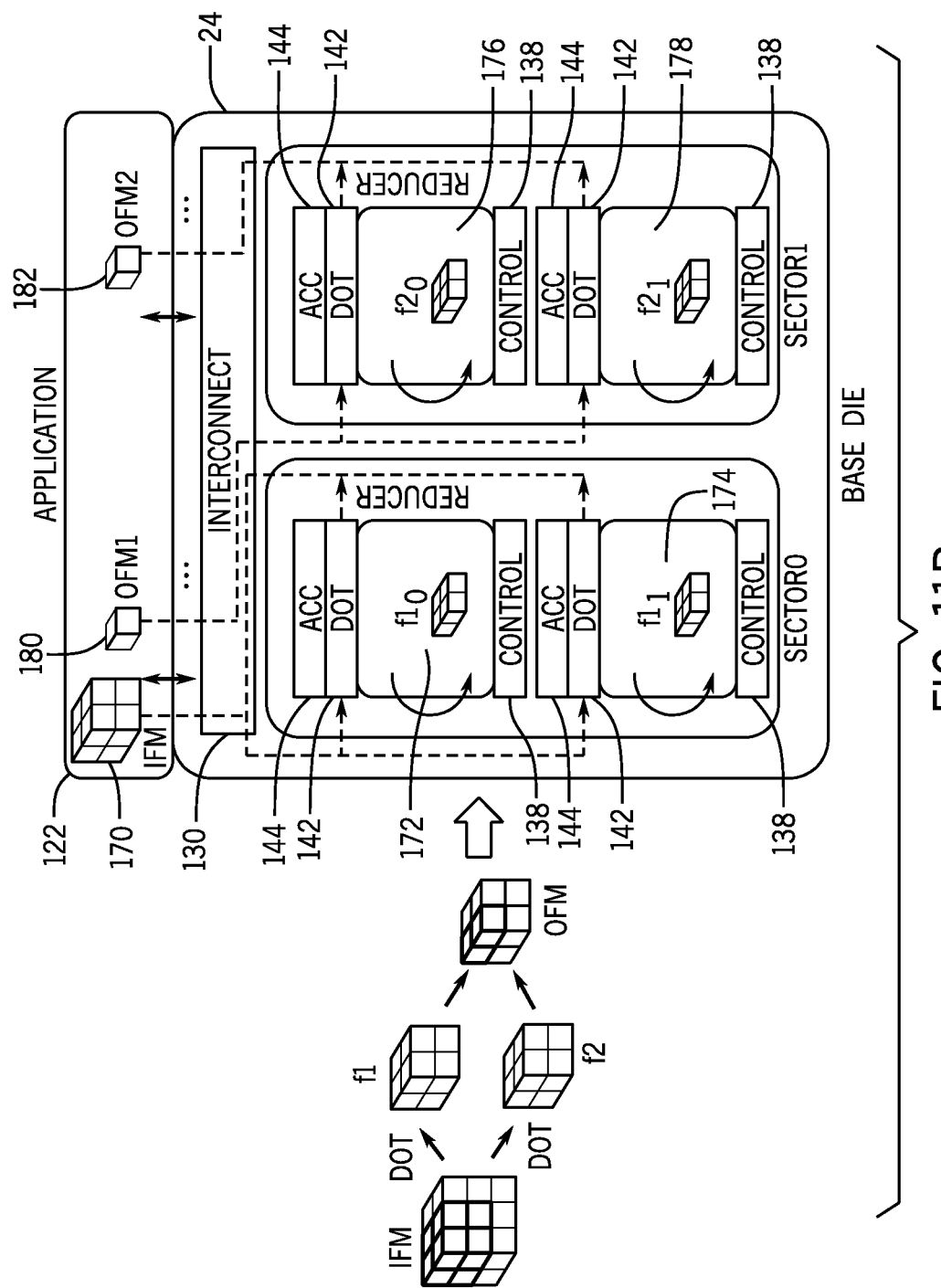
FIG. 11B is a block diagram of a configuration of the compute-in-memory circuitry on the base die that may be used for artificial intelligence (AI) convolutional operations, in accordance with an embodiment.

To illustrate the type of dot product operations that may be performed using the compute-in-memory architecture described above, FIG. 11A shows a sequence of computations to perform matrix operations and FIG. 11B shows a sequence of computations to perform convolution operations. In FIG. 11A, multiple vectors may be simultaneously sent from the application 122 to the base die 24. As shown, the base die 24 memory may be grouped into multiple sectors 136, such as a first sector 150 (sector 0) and a second sector 152 (sector 1). The application 122 may send a first vector input 154 ($Vi_0$) to a first sector 0 aligned memory 158 and second sector 0 aligned memory 159. The application may also send a second vector input ($Vi_1$) to first sector 1 aligned memory 160 and a second sector 1 aligned memory 161. The sector 0 aligned memories 158, 159 and the sector 1 aligned memories 160, 161 may already store matrix data, such as a first matrix 162 ($M_0$) and a second matrix 164 ($M_1$).

Thus, the dot product engines 142 corresponding to sector 0 aligned memories 158, 159 may compute a product of the first vector input 154 and the first matrix 162, and a product of the first vector input 154 and the second matrix 164, to determine $M_{0,0}$ and $M_{0,1}$. These partial computations may be gathered or accumulated by the accumulator 144, and reduced using the techniques described above, and read to the application 122 to be stored as a partial sum, first vector output 166, $Vo_0$. Similarly, the dot product engines 142 corresponding to sector 1 aligned memories 160, 161 may compute a product of the second vector input 156 and the first matrix 162, and a product of the second vector input 156 and the second matrix 164, to determine $M_{1,0}$ and $M_{1,1}$. These partial computations performed by the dot product engines 142 may be gathered or accumulated by the accumulator 144, and then reduced to a final value (e.g., a partial vector input or output), and read to the application 122 to be stored as a partial sum, second vector output 168, $Vo_1$. The first and second vector outputs $Vo_0$ and $Vo_1$ may be summed to determine vector output, Vo.

As illustrated in FIG. 11B, the same compute-in-memory architecture of FIG. 11A may also be used to perform other tensor operations, such as convolution operations. The convolution operations may be performed in a similar manner as the sequential process described in FIG. 11A (e.g., dot product engines 142 corresponding to sector-aligned memories that may be used to determine partial tensor products). As shown, an input feature map (IFM) 170 may be inputs sent from the application 122 to the dot product engines 142. The sector-aligned memories 172, 174, 176, 178 may store functions, f1 and f2, which may be used by the dot product engines 142 for convolution computations. The computations may be gathered and reduced by the accumulators 144 using the techniques described above, and read to the application 122 to be stored as partial feature maps, such as a first output feature map 180 (OFM1) and a second output feature map 182 (OFM2). The application 122 may use the partial feature maps 180, 182 to determine the overall output feature map for the convolution operation.

The controller 138 may be instructed by a user or application 122 to perform different partial operations across the memory sectors, such as operations for matrix/vector computations of FIG. 11A or convolution computations of FIG. 11B. Thus, the compute-in-memory architecture may be used to perform various complex mathematical operations, such as those used for AI applications. The computed data may be sent to the application 122, which may then perform specific processing operations (e.g., AI operations) such as activation functions, math transforms, data format conversions, pre-processing, post-processing, input, and/or output network, or the like.

Figure 12:
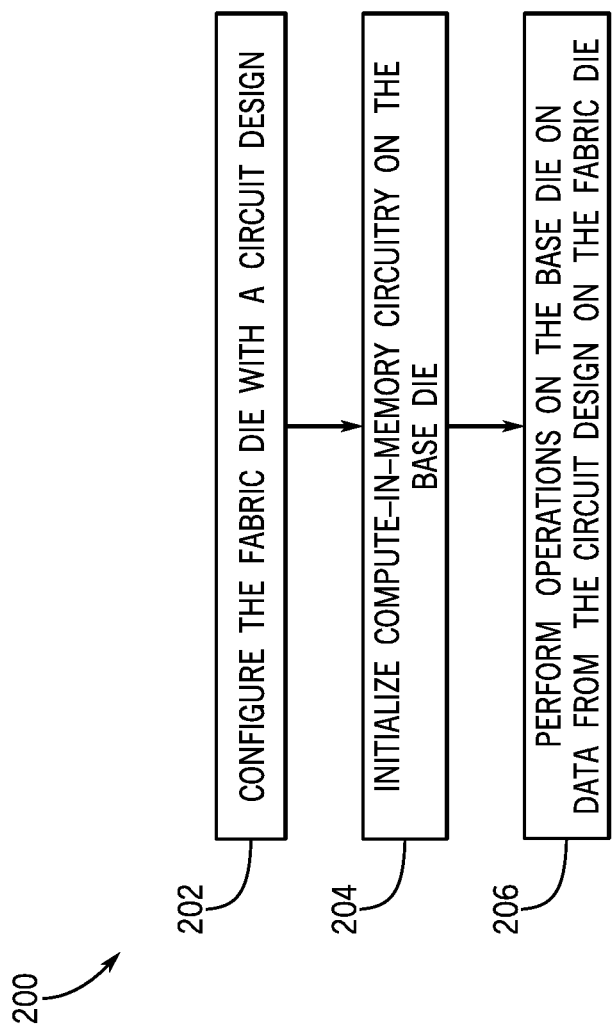
FIG. 12 is a process flow diagram for performing arithmetic operations using compute-in-memory circuitry for arithmetic computations, in accordance with an embodiment.

With the preceding in mind, and to facilitate explanation, process flow diagram 200 in FIG. 12 illustrates the compute-in-memory circuitry 71 performing compute-in-memory arithmetic computations. The fabric die 22 may be configured (block 202) with a circuit design. For example, the fabric die 22 may be configured with an application that defines an accelerator function (e.g., an artificial neural network). In addition, the compute-in-memory circuitry 71 on the base die 24 may be initialized (block 204), which may include storing computational data associated with the accelerator function (e.g., weights, matrices, or the like) in the memory on the base die 24. The compute-in-memory circuitry 71 may operate on data from the circuit design on the fabric die 22 (block 206), which may include performing partial sums or products that may be used to determine an overall sum or product. For example, multiple instances of compute-in-memory circuitry 71 in different memory sectors may provide partial sums for a matrix and vector operations, as described in FIG. 11A. Additionally or alternatively, the compute-in-memory circuitry 71 may operate and convey data in specific patterns (e.g., gather or scatter) depending on the type of arithmetic computations, as described in FIGS. 9A-9E. The results may be sent for storage to the sector-aligned memory 92 and/or may be sent to the fabric die 22.

Figure 13:
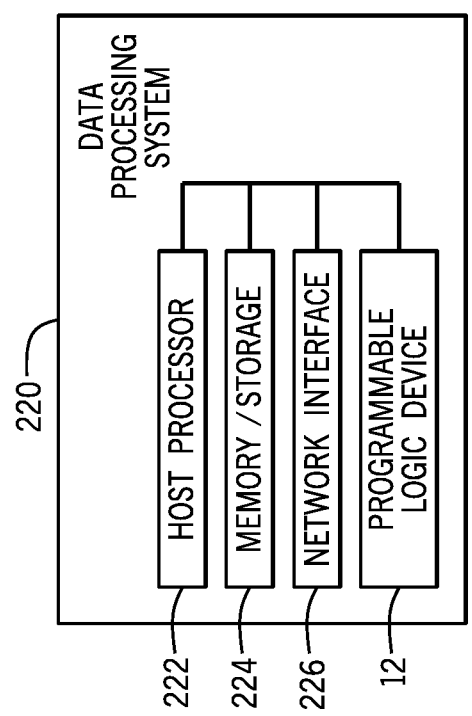
FIG. 13 is a block diagram of a data processing system that may use the programmable logic device and compute-in-memory circuitry to rapidly perform an accelerator task, in accordance with an embodiment.

The programmable logic device 12 may be, or may be a component of, a data processing system. For example, the programmable logic device 12 may be a component of a data processing system 220, shown in FIG. 13. The data processing system 220 includes a host processor 222, memory and/or storage circuitry 224, and a network interface 226. The data processing system 220 may include more or fewer components (e.g., electronic display, user interface structures, application-specific integrated circuits (ASICs)). The host processor 222 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 220 (e.g., to perform machine learning, video processing, voice recognition, image recognition, data compression, database search ranking, bioinformatics, network security pattern identification, spatial navigation, or the like). The memory and/or storage circuitry 224 may include random access memory (RAM), read-only memory (ROM), one or more hard drives, flash memory, or the like. The memory and/or storage circuitry 224 may be considered external memory to the programmable logic device 12 and may hold data to be processed by the data processing system 220. In some cases, the memory and/or storage circuitry 224 may also store configuration programs (bitstreams) for programming the programmable logic device 12. The network interface 226 may allow the data processing system 220 to communicate with other electronic devices. The data processing system 220 may include several different packages or may be contained within a single package on a single package substrate.

In one example, the data processing system 220 may be part of a data center that processes a variety of different requests. For instance, the data processing system 220 may receive a data processing request via the network interface 226 to perform machine learning, video processing, voice recognition, image recognition, data compression, database search ranking, bioinformatics, network security pattern identification, spatial navigation, or some other specialized task. The host processor 222 may cause the programmable logic fabric of the programmable logic device 12 to be programmed with a particular accelerator related to requested task. For instance, the host processor 222 may instruct that configuration data (bitstream) stored on the memory/storage 224 or cached in sector-aligned memory of the programmable logic device 12 to be programmed into the programmable logic fabric of the programmable logic device 12. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 12 that are described here, the programmable logic device 12 may rapidly assist the data processing system 220 in performing the requested task. Indeed, in one example, an accelerator may assist with a voice recognition task less than a few milliseconds (e.g., on the order of microseconds) by rapidly accessing and processing large amounts of data in the accelerator using sector-aligned memory.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application-specific standard products (ASSPs), application-specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. An integrated circuit device comprising:
programmable logic circuitry disposed on a first integrated circuit die, wherein the programmable logic circuitry comprises a first region of programmable logic circuitry, wherein the first region of programmable logic circuitry programmed with a first circuit design that operates on a first set of data; and
memory circuitry disposed on a second integrated circuit die, wherein the memory circuitry comprises a first region of memory comprising a previously stored second set of data associated with the first circuit design and first compute-in-memory circuitry, wherein the first compute-in-memory circuitry is configurable to perform an arithmetic operation using the first set of data received from the programmable logic circuitry and the second set of data previously stored in the first region of memory.

2. The integrated circuit device of claim 1, wherein the first region of programmable logic circuitry is aligned with the first region of memory.

3. The integrated circuit device of claim 1, wherein the first integrated circuit die and the second integrated circuit die are 3D stacked and communicatively coupled by an interconnect.

4. The integrated circuit device of claim 1, wherein the first region of memory comprises a first sub-region associated with the first compute-in-memory circuitry and a second sub-region associated with a second compute-in-memory circuitry.

5. The integrated circuit device of claim 1, wherein the first region of memory comprises a plurality of sub-regions and a plurality of corresponding compute-in-memory circuitry units.

6. The integrated circuit device of claim 5, wherein the first set of data is broadcasted to the plurality of compute-in-memory circuitry units.

7. The integrated circuit device of claim 5, wherein the second set of data previously stored is gathered from the plurality of compute-in-memory circuitry units.

8. An integrated circuit device comprising:
programmable logic circuitry disposed on a first integrated circuit die, wherein the programmable logic circuitry comprises a first region of programmable logic circuitry, wherein the first region of programmable logic circuitry configurable to be programmed with a first circuit design that operates on a first set of data; and
memory circuitry disposed on a second integrated circuit die, wherein the memory circuitry comprises a first region of memory and first compute-in-memory circuitry, wherein the first compute-in-memory circuitry is configurable to perform an arithmetic operation using the first set of data from the programmable logic circuitry and a second set of data stored in the first region of memory, wherein the first region of memory comprises a plurality of sub-regions and a plurality of corresponding compute-in-memory circuitry units, wherein the second set of data is gatherable from the plurality of compute-in-memory circuitry units, and wherein the plurality of compute-in-memory circuitry units are configurable to reduce the second set of data to form partial sums when computing tensor operations using the plurality of compute-in-memory circuitry units.

9. The integrated circuit device of claim 8, wherein the partial sums are used in a matrix and vector operation.

10. The integrated circuit device of claim 8, wherein the second set of data is simultaneously gathered in parallel from the plurality of compute-in-memory circuitry units.

11. The integrated circuit device of claim 8, wherein the compute-in-memory circuitry units comprise a dot product engine and an accumulate circuitry.

12. The integrated circuit device of claim 8, wherein a first sub-region of the plurality of sub-regions comprises a first controller that controls the first compute-in-memory circuitry and a second sub-region of the plurality of sub-regions comprises a second controller that controls the second compute-in-memory circuitry.

13. One or more tangible, non-transitory, machine-readable media comprising machine-readable instructions executable by one or more processors, wherein the instructions comprise instructions to:
configure programmable logic circuitry of a first die with a first circuit design;
initialize memory circuitry of a second die in communication with the first die, wherein the memory circuitry of the second die comprises compute-in-memory circuitry, wherein initializing the memory circuitry comprises storing computational data for use with the first circuit design into the memory circuitry of the second die;
transmitting input data from the first die to the second die;
causing an arithmetic operation to be performed on the compute-in-memory circuitry of the memory circuitry of the second die using the received input data and the computational data previously stored to generate output data; and
transmitting the output data from the second die to the first die.

14. The machine-readable media of claim 13, wherein the arithmetic operation comprises a dot product operation, an accumulation operation, a matrix operation, a vector operation, a convolution operation, or a combination thereof.

15. The machine-readable media of claim 13, wherein:
the first circuit design comprises a filtering function; and
the computational data associated with the first circuit design comprises one or more filter coefficients.

16. The machine-readable media of claim 13, wherein:
the first circuit design comprises an artificial neural network function; and
the computational data associated with the first circuit design comprises one or more neutral network weights.

17. A data center system comprising:
a first region of circuitry comprising programmable logic circuitry that can be configured with a circuit design; and
a second region of circuitry comprising memory circuitry to store a set of data when the programmable logic circuitry is configured with circuit design, wherein the memory circuitry comprises integral compute-in-memory circuitry configurable to perform an arithmetic operation based at least in part on the set of data previously stored in the memory circuitry; and
a processor configurable to cause the first region of the circuitry to be configured with the circuit design and cause the set of data to be stored on the second region.

18. The data center system of claim 17, wherein the processor is configured to initialize the memory circuitry by causing the set of data previously stored to be loaded into the memory circuitry.

19. The data center system of claim 17, wherein the circuit design comprises an artificial intelligence (AI) application, wherein results of the arithmetic operation of the computein-memory circuitry are configured to be sent to the first region, and wherein the artificial intelligence application of the circuit design on the first region is configured to perform an application-specific process comprising an activation function, a transform, a data format conversion, pre-processing, post-processing, or a combination thereof.

20. The data center system of claim 17, wherein the first region is disposed on a first die and the second region is disposed on a second die.

\* \* \* \* \*